(12) United States Patent
Lai et al.

(10) Patent No.: US 9,545,041 B2
(45) Date of Patent: Jan. 10, 2017

(54) I/O DEVICE, METHOD FOR PROVIDING ESD PROTECTION FOR AN I/O DEVICE AND ESD PROTECTION DEVICE FOR AN I/O DEVICE

(71) Applicant: NXP B.V., Eindhoven (NL)

(72) Inventors: Da-Wei Lai, Nijmegen (NL); Taede Smedes, Nijmegen (NL)

(73) Assignee: NXP B.V., Eindhoven (NL)

( * ) Notice: Subject to any disclaimer, the term of this patent is extended or adjusted under 35 U.S.C. 154(b) by 115 days.

(21) Appl. No.: 14/282,581

(22) Filed: May 20, 2014

(65) Prior Publication Data

US 2015/0342098 A1  Nov. 26, 2015

(51) Int. Cl.
| | | |
|---|---|---|
| *H02H 3/22* | (2006.01) | |
| *H05K 9/00* | (2006.01) | |
| *H03K 19/003* | (2006.01) | |
| *H05K 1/02* | (2006.01) | |
| *H01L 27/02* | (2006.01) | |
| *H02H 9/04* | (2006.01) | |
| *H01L 23/60* | (2006.01) | |

(52) U.S. Cl.
CPC ...... *H05K 9/0067* (2013.01); *H03K 19/00346* (2013.01); *H01L 23/60* (2013.01); *H01L 27/0255* (2013.01); *H01L 2924/0002* (2013.01); *H02H 9/046* (2013.01); *H05K 1/0259* (2013.01)

(58) Field of Classification Search
USPC ................................................ 361/56, 111
See application file for complete search history.

(56) References Cited

U.S. PATENT DOCUMENTS

| | | | |
|---|---|---|---|
| 6,529,359 B1 | 3/2003 | Verhaege et al. | |
| 7,663,851 B2 | 2/2010 | Huang et al. | |
| 7,911,752 B1* | 3/2011 | Lin | H02H 9/046 361/56 |
| 2009/0323234 A1* | 12/2009 | Bach | H01L 27/0251 361/56 |
| 2013/0235496 A1* | 9/2013 | Lai | H02H 9/046 361/56 |
| 2013/0265677 A1* | 10/2013 | Prabhu | H01L 27/0292 361/56 |
| 2013/0321962 A1* | 12/2013 | Lai | H01L 27/0292 361/56 |

* cited by examiner

*Primary Examiner* — Danny Nguyen (57) ABSTRACT

Embodiments of a method for providing electrostatic discharge (ESD) protection for an Input/Output (I/O) device, an ESD protection device for an I/O device, and an I/O device are described. In one embodiment, a method for providing ESD protection for an I/O device involves activating a switch device to turn off the I/O device during an ESD event and deactivating the switch device to turn on the I/O device in the absence of an ESD event. Other embodiments are also described.

19 Claims, 12 Drawing Sheets

I/O DEVICE, METHOD FOR PROVIDING ESD PROTECTION FOR AN I/O DEVICE AND ESD PROTECTION DEVICE FOR AN I/O DEVICE

Embodiments of the invention relate generally to electronic hardware and methods for operating electronic hardware, and, more particularly, to electrostatic discharge (ESD) protection devices, integrated circuit (IC) devices and methods for providing ESD protection for IC devices.

An ESD protection circuit can be integrated onto an IC chip to provide a low impedance channel to ground to prevent damage in the IC chip. For example, the ESD protection circuit can be used to protect a supply domain of an IC chip from overheating during an ESD strike by shunting the ESD current from the supply domain to the ground domain.

Typically, there are two types of ESD protection schemes for Input/Output (I/O) devices. One ESD protection scheme involves coupling a shunt ESD protection device in parallel with an I/O device and the other ESD protection scheme involves integrating an ESD protection device with an I/O device. Providing an I/O device with parallel shunt ESD protection can provide good ESD protection. However, because an ESD protection device normally requires larger dimensions to meet an ESD specification, an I/O device with parallel shunt ESD protection typically has a relatively large circuit footprint. An ESD self-protected I/O device can be more efficient with respect to footprint size. However, for both the I/O device with parallel shunt ESD protection and the ESD self-protected I/O device, an undesirable current path can develop through the I/O device due to the unknown state of the I/O device during an ESD event. Therefore, there is a need for an ESD protection device for an I/O device that efficiently uses circuit real estate while preventing undesirable current paths through the I/O device caused by the unknown state of the I/O device.

Embodiments of a method for providing electrostatic discharge (ESD) protection for an Input/Output (I/O) device, an ESD protection device for an I/O device, and an I/O device are described. In one embodiment, a method for providing ESD protection for an I/O device involves activating a switch device to turn off the I/O device during an ESD event and deactivating the switch device to turn on the I/O device in the absence of an ESD event. Compared to other ESD protection schemes, activating and deactivating a switch device to turn on and off an I/O device allows the I/O device to operate normally in the absence of an ESD event and to be shut down during an ESD event to protect against ESD damage. Other embodiments are also described.

In one embodiment, a method for providing ESD protection for an I/O device involves activating a switch device to turn off the I/O device during an ESD event and deactivating the switch device to turn on the I/O device in the absence of an ESD event.

In one embodiment, an ESD protection device for an I/O device includes an ESD element configured to conduct an ESD current during an ESD event and a switch device configured to be activated to turn off the I/O device during the ESD event and to be deactivated to turn on the I/O device in the absence of an ESD event.

In one embodiment, an I/O device includes an n-channel MOSFET (NMOS) I/O driver circuit connected to an I/O terminal, an ESD element configured to conduct an ESD current away from the NMOS I/O driver during an ESD event, and a switch device configured to be activated to turn off the NMOS I/O driver circuit during the ESD event and to be deactivated to turn on the NMOS I/O driver circuit in the absence of an ESD event.

Other aspects and advantages of embodiments of the present invention will become apparent from the following detailed description, taken in conjunction with the accompanying drawings, depicted by way of example of the principles of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
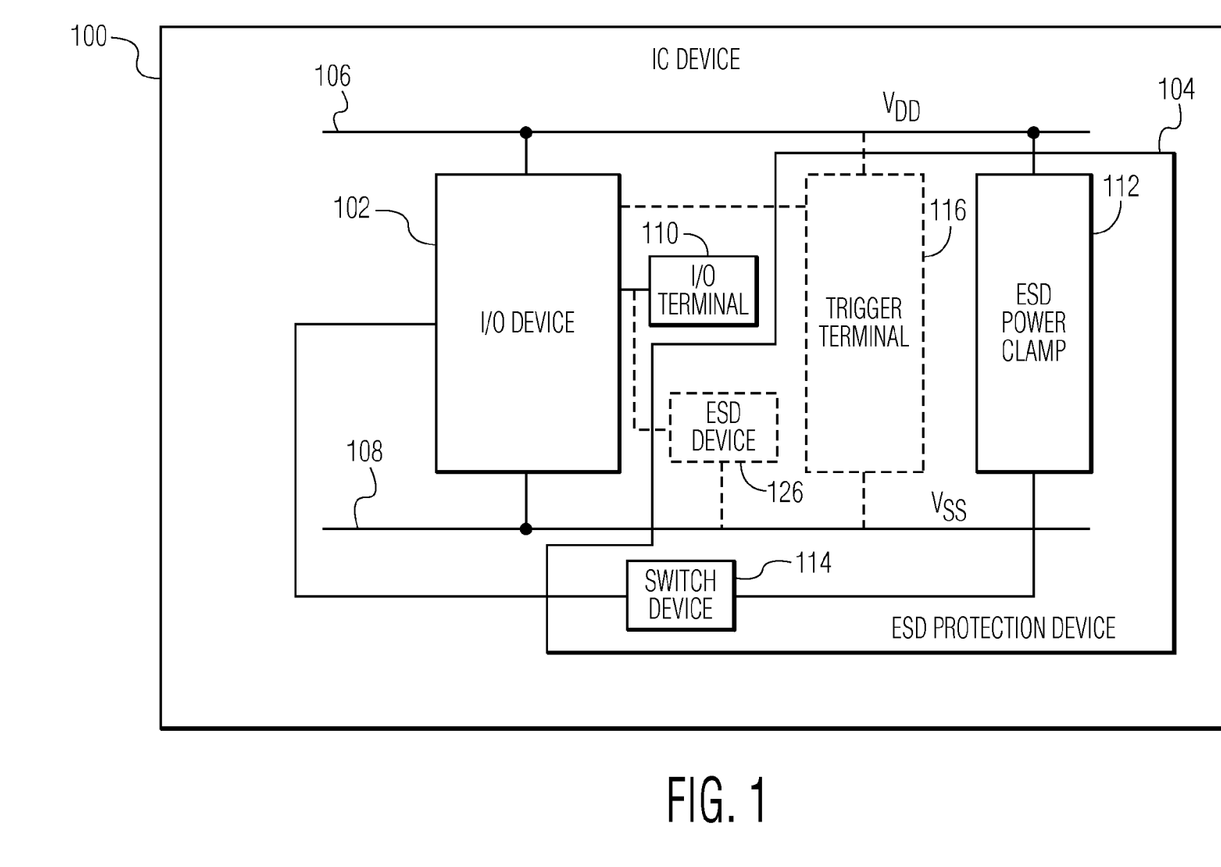
FIG. 1 is a schematic block diagram of an IC device in accordance with an embodiment of the invention.

FIG. 1 is a schematic block diagram of an IC device 100 in accordance with an embodiment of the invention. In the embodiment depicted in FIG. 1, the IC device includes an Input/Output (I/O) device 102 and an ESD protection device 104 that is used to protect the I/O device during an ESD event, which may be an ESD test or an actual ESD strike. The IC device can be used in various applications, such as automotive applications, communications applications, industrial applications, medical applications, computer applications, and/or consumer or appliance applications. The IC device can be implemented in a substrate, such as a semiconductor wafer. In an embodiment, the IC device is packaged into a semiconductor IC chip.

The I/O device 102 is a device to be protected by the ESD protection circuit 104 if an ESD event occurs. The I/O device typically includes one or more circuit components that are susceptible to ESD strikes. In some embodiments, the I/O device includes an I/O driver circuit. The I/O device is connected to different voltage rails with different voltages. In the embodiment depicted in FIG. 1, the I/O device is connected to a high power supply rail 106 having a voltage, "$V_{DD}$," and a low power supply rail 108 having a voltage, "$V_{SS}$," which is lower than the voltage, "$V_{DD}$." In some embodiments, the low power supply rail is connected to ground and the voltage, "$V_{SS}$," is 0 volts (V). The I/O device is connected to an I/O terminal 110, which is used to receive input signals and send output signals.

The ESD protection device 104 protects the I/O device 102 during an ESD event. In the embodiment depicted in FIG. 1, the ESD protection device includes an ESD power clamp 112, a switch device 114, an optional trigger device 116 for the switch device, and an optional ESD device 126 connected between the I/O device 102/the I/O terminal 110 and the low power supply rail 108. The ESD device 126 is used to provide ESD protection for the I/O device/the I/O terminal. Although the ESD protection device is shown in FIG. 1 as including the ESD power clamp and the switch device, in other embodiments, the ESD protection device may include one or more additional circuit elements. For example, the ESD protection device may include one or more additional ESD elements. In some embodiments, the ESD protection device does not include the ESD device 126.

The ESD power clamp 112 and the optional ESD device 126 form an ESD element, which is used to protect the I/O device 102 by conducting the ESD current during an ESD event. In some embodiments, the ESD element includes one or more additional diodes for ESD protection. The ESD power clamp is connected in parallel with the I/O device between the two voltage rails. In the embodiment depicted in FIG. 1, the ESD power clamp is connected to the high power supply rail 106 having the voltage, "$V_{DD}$," and the low power supply rail 108 having the voltage, "$V_{SS}$." The ESD power clamp may be an active ESD power clamp or a passive ESD power clamp. In an embodiment, the ESD power clamp protects the I/O device from overvoltage during an ESD event by shunting the ESD current from the power supply rail 106 to the low power supply rail 108 (e.g., the ground).

The switch device 114 is configured to be activated to turn off the I/O device 102 during an ESD event and to be deactivated to turn on the I/O device in the absence of an ESD event. In an embodiment, when the switch device is activated, the switch device conducts current (i.e., in the ON position), and when the switch device is deactivated, the switch device does not conduct current (i.e., in the OFF position). In some embodiments, the switch device is configured to control the application of a voltage at a gate terminal of the I/O device. In an embodiment, the switch device causes zero voltage potential to be applied to a gate terminal of the I/O device in case of an ESD event such that the I/O device is turned off during the ESD event. In an embodiment, when the I/O device is turned off by the switch device during an ESD event, the I/O device does not conduct current, in particular, the ESD current, and does not have an unknown state during an ESD event. Consequently, undesirable current paths through the I/O device caused by the unknown state of the I/O device can be prevented. In an embodiment, the switch device causes a non-zero voltage potential to be applied to a gate terminal of the I/O device in the absence of an ESD event such that the I/O device is turned on in the absence of an ESD event. In an embodiment, when the I/O device is turned on by the switch device in the absence of an ESD event, the I/O device conducts current and operates normally in the absence of an ESD event. Consequently, the switch device does not interfere with the normal operation of the I/O device. The I/O device can be entirely turned on/off or partially turned on/off. In some embodiments, a component of the I/O device is turned off during an ESD event such that the component does not conduct current, in particular, the ESD current, during an ESD event, and is turned on in the absence of an ESD event such that the component conducts current and operates normally in the absence of an ESD event. In an embodiment, the I/O device includes an NMOS device such as an NMOS transistor, and the switch device is configured to control the application of the voltage at a gate terminal of the NMOS device during an ESD event and in the absence of an ESD event. For example, the switch device is configured to connect a gate terminal of the NMOS device to ground during an ESD event and to disconnect the NMOS device from ground in the absence of an ESD event.

In some embodiments, the switch device 114 is switched by the ESD power clamp 112. In an embodiment, the ESD power clamp is configured to generate an ESD trigger signal by conducting the ESD current (e.g., to the low power supply rail 108) during an ESD event and the switch device is configured to be activated in response to the ESD trigger signal. In some embodiments, the switch device is switched by the optional trigger device 116. In an embodiment, the trigger device is configured to generate an ESD trigger signal during an ESD event and the switch device is configured to be activated in response to the ESD trigger signal. The switch device may be configured to control the application of a voltage at the I/O device.

Control devices for I/O driver circuits have typically been realized using multiple circuit elements. For example, control devices for I/O driver circuits include a combination of resistors and diode strings or a combination of capacitors, resistors, and transistors. The number of circuit elements used in a control device can be affected by the operating voltage of an I/O driver circuit. In addition, control devices for I/O driver circuits typically have negative impacts on I/O driver function. For example, a capacitive load can negatively impact the speed/function of an I/O driver circuit. In addition, it is difficult to implement control devices in a realistic I/O chip design due to interference with the I/O cell function. Further, control devices for I/O driver circuits typically require a large circuit area within an I/O cell, which may not be feasible for some applications.

Compared to other control devices for I/O driver circuits, the switch device 114 as shown in FIG. 1 can be implemented as a single transistor. In addition, the switch device is deactivated to turn on the I/O device 102 in the absence of an ESD event. Consequently, the switch device does not impact the normal operation of the I/O device. Further, the switch device can be implemented in a small circuit area.

The optional trigger device 116 can be used to generate an ESD trigger signal during an ESD event to activate the switch device 114. In some embodiments, the trigger device is connected to the high power supply rail 106 and to the low power supply rail 108 such that the trigger device is connected in parallel with the I/O device. In some embodiments, the trigger device is connected to a separate voltage rail that is connected to the I/O device 102.

FIGS. 2-6 depict some embodiments of the IC device 100 depicted in FIG. 1 that use the trigger device 116 to control the switch device 114. Using the trigger device, instead of the ESD power clamp 112, to control the switch device allows the IC device to use a non-active ESD power clamp. Active ESD power clamps, such as Resistor Capacitor (RC)-triggered ESD power clamps, can cause noise induced false triggering and have a relatively large footprint. The IC devices 200, 400, 600 shown in FIGS. 2, 4, and 6, respectively, are some possible implementations of the IC device 100 depicted in FIG. 1. However, the IC device 100 depicted in FIG. 1 can be implemented differently from the IC devices depicted in FIGS. 2-6 and the invention is not restricted to the particular implementation of the IC devices depicted in FIGS. 2-6.

Figure 2:
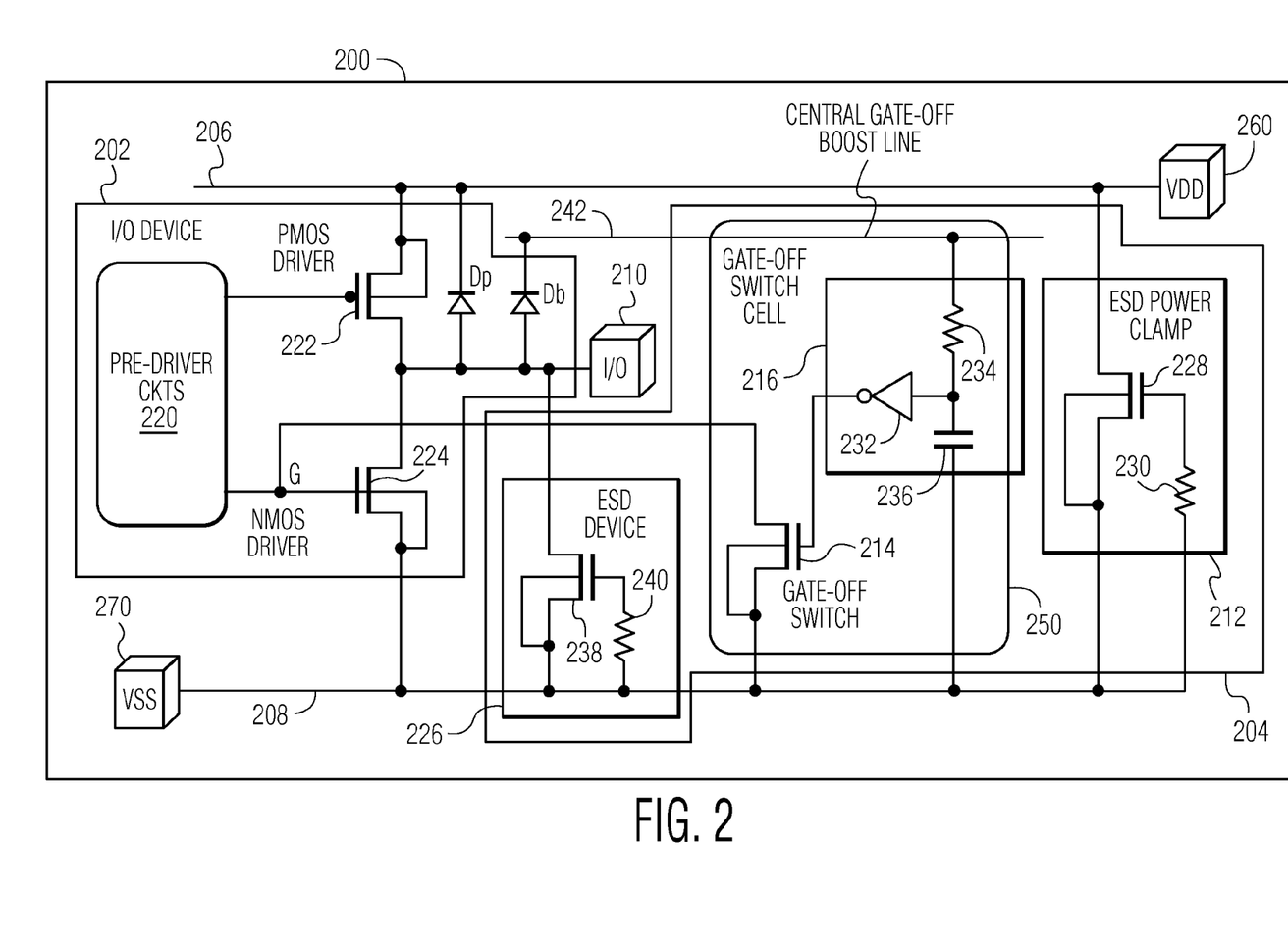
FIG. 2 depicts an embodiment of the IC device depicted in FIG. 1 that uses a trigger device to control a switch device.

FIG. 2 depicts a first embodiment of the IC device 100 depicted in FIG. 1 that uses the trigger device 116 to control the switch device 114. In the embodiment depicted in FIG. 2, an IC device 200 includes an I/O device 202 and an ESD protection device 204 that is used to protect the I/O device during an ESD event. Compared to other ESD protection devices, the ESD protection device 204 reduces the possibility of false triggering of an NMOS driver circuit 224 of the I/O device 202 and allows for the use of a snapback ESD clamp 212.

The I/O device 202 of the IC device 200 includes pre-driver circuits 220, a PMOS driver circuit 222, the NMOS driver circuit 224, a diode, "Dp," and a boost dedicated diode, "Db." In the embodiment depicted in FIG. 2, the I/O device is connected to a high power supply rail 206, a low power supply rail 208, and an I/O terminal 210. The high power supply rail 206 is connected to a voltage pin 260 having a voltage, "$V_{DD}$," while the low power supply rail 208 is connected to a voltage pin 270 having a voltage, "$V_{SS}$." The diode, "Dp," is used to enhance ESD current conduction between the I/O terminal 210 and the voltage pin 260. During an ESD event, ESD current flows through the parasitic diode of the PMOS driver circuit if the dedicated diode, "Dp," is not present. Although the diodes, "Dp," and "Db," are shown in FIG. 2 as being part of the I/O device, in other embodiments, the diodes, "Dp," and "Db," are part of the ESD protection device 204.

The ESD protection device 204 of the IC device 200 includes the ESD power clamp 212, a switch device 214 that is implemented as a gate-off transistor, a trigger device 216 for the gate-off transistor, and an ESD device 226. In some embodiments, the switch device is implemented as an inverter chain. The gate-off transistor, which can be local in every I/O cell of the I/O device 202 or shared by multiple I/O cells, is configured to be activated to turn off the I/O device during the ESD event and to be deactivated to turn on the I/O device in the absence of an ESD event. The ESD device 226 is used to enhance the ESD performance by creating another ESD conduction path.

The gate-off transistor 214 and the trigger device 216 form a gate-off switch cell 250. In the embodiment depicted in FIG. 2, the ESD power clamp includes a transistor 228 and a resistor 230. The trigger device 216 includes an inverter 232, a resistor 234, and a capacitor 236. The ESD device includes a transistor 238 and a resistor 240. The boost dedicated diode, "Db," and the gate-off transistor are only activated during an ESD event. The gate-off transistor remains inactive under normal operation. Consequently, the gate-off transistor has little or no impact on the normal operation of the I/O device 202.

In the embodiment depicted in FIG. 2, the trigger device 216 is connected to a central gate-off boost line 242 as opposed to the high power supply rail 206. Because the trigger device 216 is not directly connected to the high power supply rail 206 having the voltage, "$V_{DD}$," false triggering is avoided during large noise damping. The IC device 200 can be used in ESD applications in which a Resistor-Capacitor (RC)-trigger circuit between the power pin (VDD) 260 and the power pin (VSS) 270 is not suitable due to the risk that large noise may induce false triggering.

An operation example of the ESD protection device 204 of FIG. 2 is described as follows. During an ESD event, positive ESD zapping from the I/O terminal 210 to the low power supply rail 208 causes the ESD current to flow through the diode, "Dp," and the parasitic diode of PMOS driver circuit 222 to the high power supply rail 206 and through the ESD power clamp 212 to the low power supply rail. Simultaneously, the voltage of the I/O terminal 210 that couples to the gate-off boost line 242 changes, which activates the gate-off transistor 214 to pull the gate terminal, "G," of the NMOS driver circuit 224 down to zero voltage potential. The shunt ESD device 226 operates between the high power supply rail 206 and the low power supply rail 208 to improve ESD performance. In the absence of an ESD event, a voltage in the normal range of operation (e.g., 3.3V or any other suitable voltage) is applied to the I/O terminal and the voltage of the gate-off boost line 242 is close to the voltage that is applied to the I/O terminal, which is sufficient to switch off the gate-off transistor 214. Consequently, the ESD protection device has no impact on the I/O device 202 in the absence of an ESD event.

Figure 3:
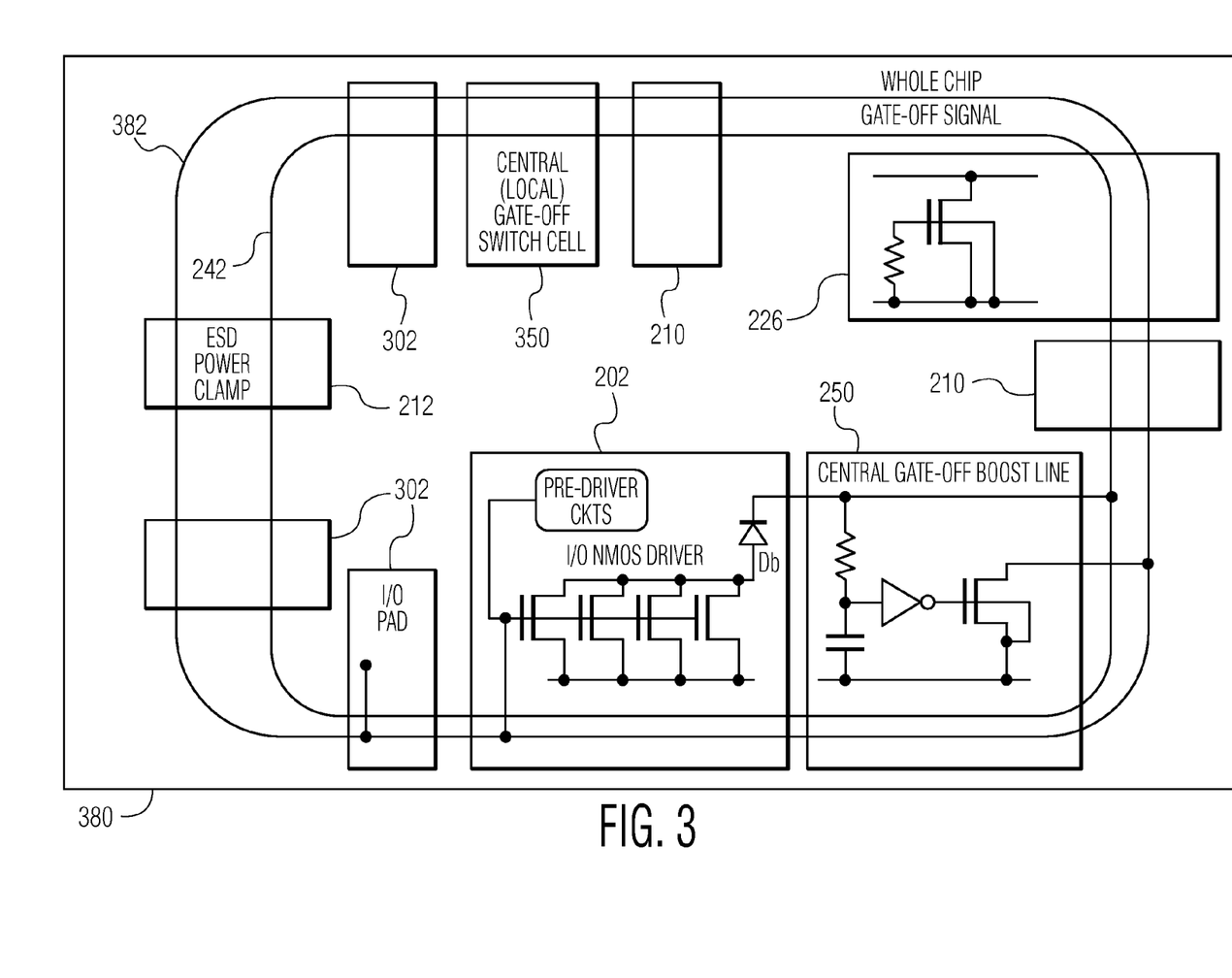
FIG. 3 depicts an IC chip that includes the IC device depicted in FIG. 2 in accordance with an embodiment of the invention.

FIG. 3 depicts an IC chip 380 that includes the IC device 200 depicted in FIG. 2 in accordance with an embodiment of the invention. In the embodiment depicted in FIG. 3, the IC chip is a whole-chip I/O ring, which includes the I/O device 202, the ESD power clamp 212, the gate-off switch cell 250 (which includes the gate-off transistor 214 and the trigger device 216), the ESD device 226, other I/O devices (I/O terminals/pads) 302, and an optional second gate-off switch cell 350. The IC chip depicted in FIG. 3 has a whole chip gate-off signal line 382 and a gate-off boost line 242 that are shared among different components of the IC chip. In some embodiments, the IC chip has multiple power domains and each power domain has its own ESD arrangement.

Figure 4:
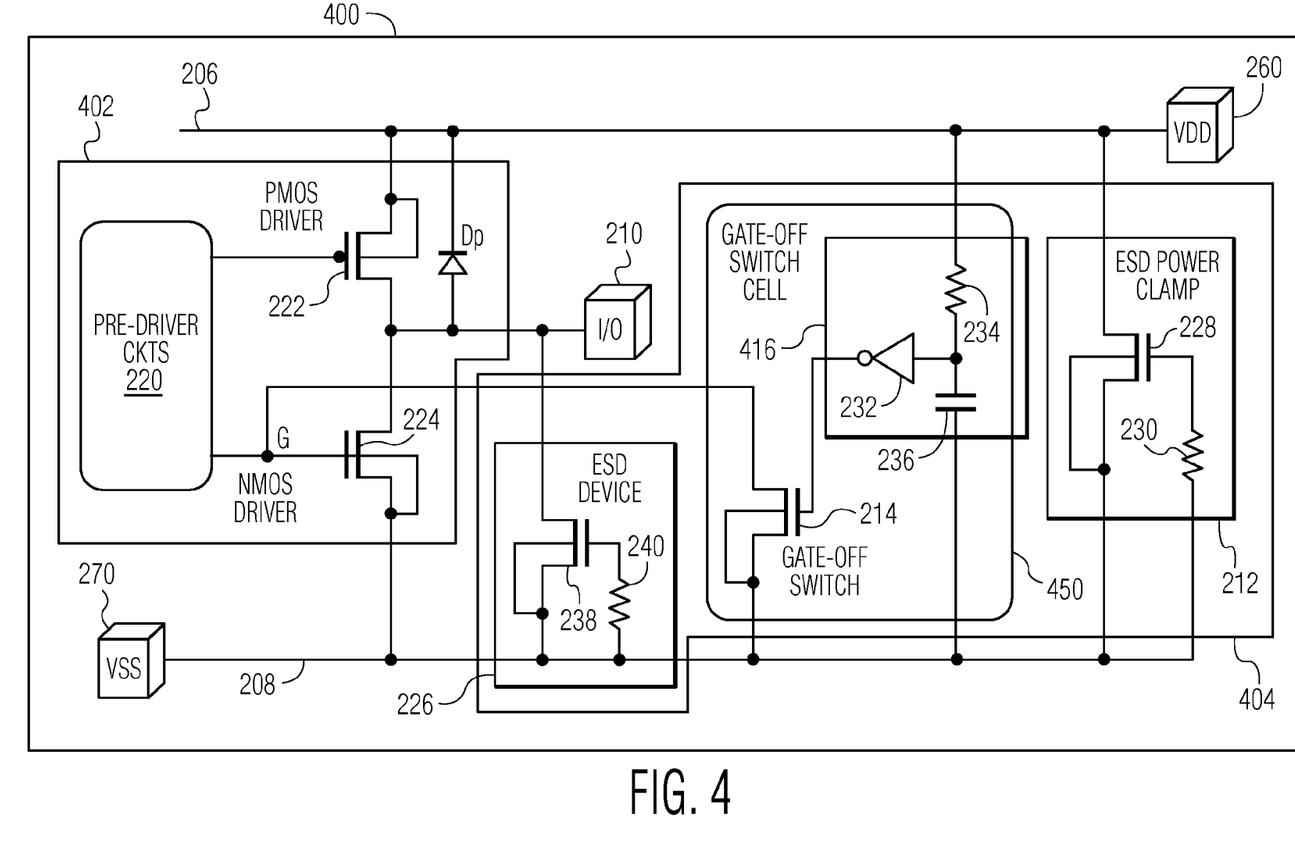
FIG. 4 depicts another embodiment of the IC device depicted in FIG. 1 that uses a trigger device to control a switch device.

FIG. 4 depicts another embodiment of the IC device 100 depicted in FIG. 1 that uses the trigger device 116 to control the switch device 114. In the embodiment depicted in FIG. 4, an IC device 400 includes an I/O device 402 and an ESD protection device 404 that is used to protect the I/O device during an ESD event. The I/O device includes a PMOS driver circuit 222, an NMOS driver circuit 224, and the diode, "Dp." The I/O device is connected to the high power supply rail 206, the low power supply rail 208, and the I/O terminal 210. Although the diode, "Dp," is shown in FIG. 4 as being part of the I/O device, in other embodiments, the diode, "Dp," is part of the ESD protection device. The ESD protection device includes the ESD power clamp 212, the switch device 214 (which is implemented as a gate-off transistor), a trigger device 416 for the gate-off transistor, and the ESD device 226. The gate-off transistor and the trigger device form a gate-off switch cell 450. In the embodiment depicted in FIG. 4, the trigger device 416 includes the inverter 232, the resistor 234, and the capacitor 236. The gate-off transistor is activated during an ESD event and remains inactive under normal operation. Consequently, the gate-off transistor has little or no impact on the normal operation of the I/O device 402. Compared to the IC device 200 depicted in FIG. 2, the IC device 400 depicted in FIG. 4 includes the trigger device 216, which is connected to the high power supply rail 206. In addition, the IC device 400 depicted in FIG. 4 does not include the diode, "Dp."

Figure 5:
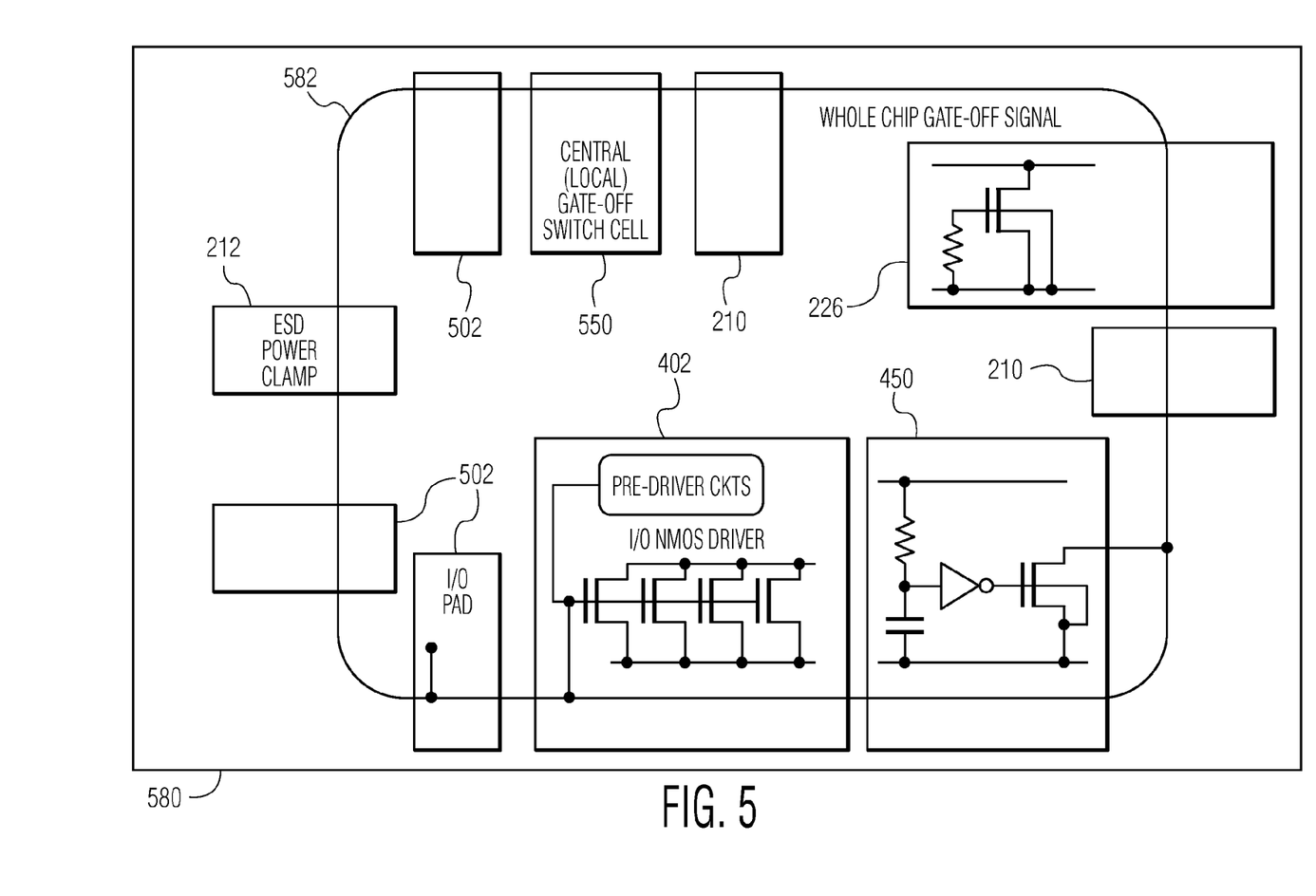
FIG. 5 depicts an IC chip that includes the IC device depicted in FIG. 4 in accordance with an embodiment of the invention.

FIG. 5 depicts an IC chip 580 that includes the IC device 400 depicted in FIG. 4 in accordance with an embodiment of the invention. In the embodiment depicted in FIG. 5, the IC chip 580 is a whole-chip I/O ring, which includes the I/O device 402, the ESD power clamp 212, the gate-off switch cell 450 (which includes the gate-off transistor 214 and the trigger device 416), the ESD device 226, other I/O devices (I/O pads) 502, and an optional second gate-off switch cell 550. The IC chip depicted in FIG. 5 has a whole chip gate-off signal line 582 that is shared among different components of the IC chip. In some embodiments, the IC chip has multiple power domains and each power domain has its own ESD arrangement.

Figure 6:
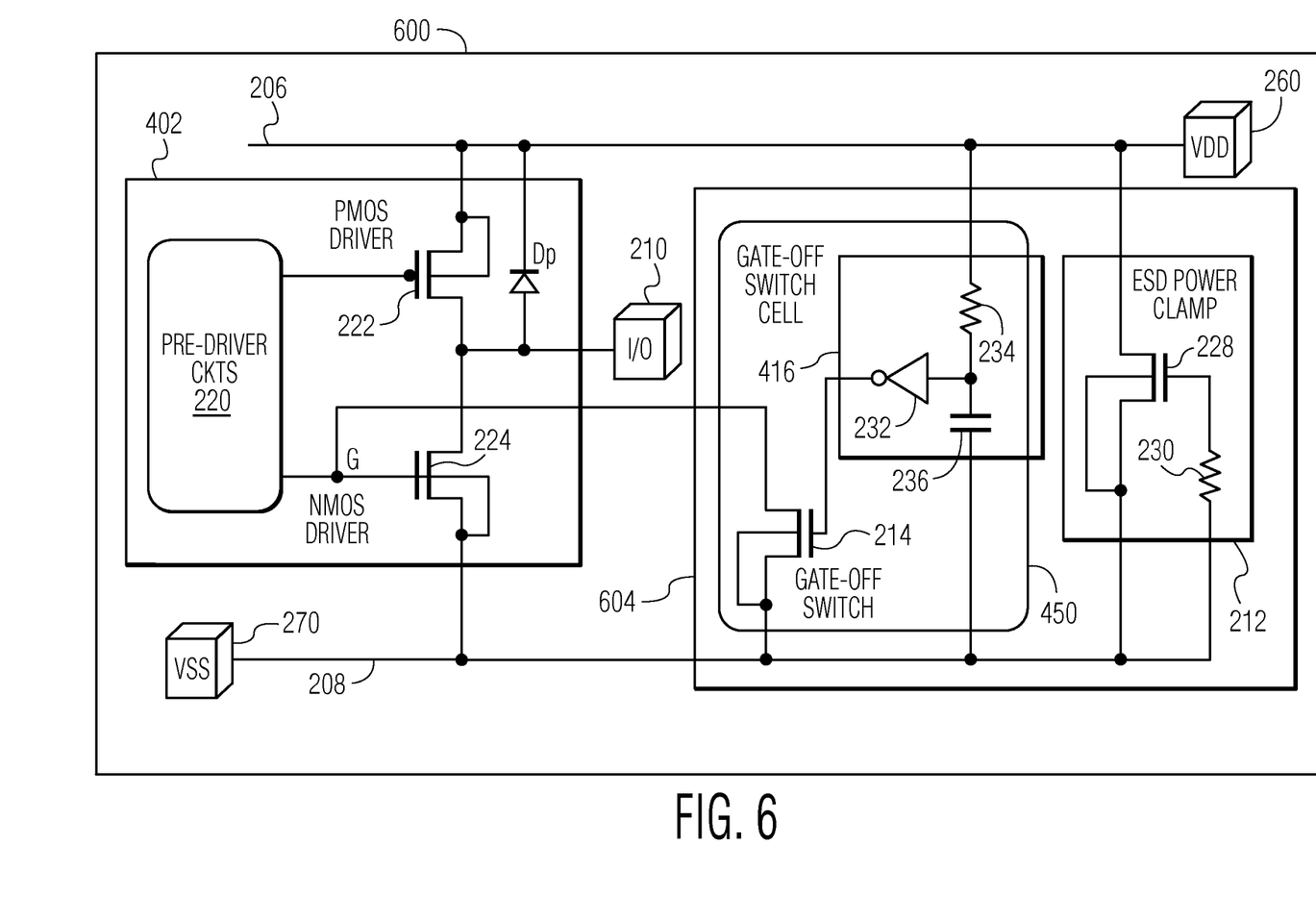
FIG. 6 depicts another embodiment of the IC device depicted in FIG. 1 that uses a trigger device to control a switch device.

FIG. 6 depicts another embodiment of the IC device 100 depicted in FIG. 1 that uses the trigger device 116 to control the switch device 114. In the embodiment depicted in FIG. 6, an IC device 600 includes an I/O device 402 and an ESD protection device 604 that is used to protect the I/O device during an ESD event. The ESD protection device includes the ESD power clamp 212, the switch device 214 (which is implemented as a gate-off transistor), and the trigger device 416 for the gate-off transistor. The gate-off transistor and the trigger device form a gate-off switch cell 450. Although the diode, "Dp," is shown in FIG. 6 as being part of the I/O device, in other embodiments, the diode, "Dp," is part of the ESD protection device. Compared to the IC device 400 depicted in FIG. 4, the IC device 600 depicted in FIG. 6 does not include the ESD device 226, which is optionally used to enhance the ESD performance by creating another ESD conduction path.

An example of the operation of the ESD protection device 604 depicted in FIG. 6 is described as follows. During an ESD event, positive ESD zapping from the I/O terminal 210 to the low power supply rail 208 causes ESD current to flow through the dedicated diode, "Dp," and the parasitic diode of PMOS driver to the high power supply rail 206, which triggers the gate-off switch cell and activates the gate-off transistor and pulls down the gate terminal, "G," of the NMOS driver circuit 224 to zero voltage potential. Consequently, the state of the NMOS driver circuit during an ESD event is defined such that the ESD current can also be conducted through the NMOS driver circuit in a snap-back mode. In the absence of an ESD event, the gate-off switch cell is inactive and the ESD protection device 604 does not interfere with the normal operation of the I/O device 402.

FIGS. 7-11 depict some embodiments of the IC device 100 depicted in FIG. 1 that use an active ESD power clamp to control the switch device 114. Compared to a non-active ESD power clamp, an active ESD power clamp, such as a Resistor Capacitor (RC)-triggered ESD power clamps, has better ESD performance because of the active components used in the active ESD power clamp. The IC devices 700, 800, 1000, 1100 depicted in FIGS. 7, 8, 10, and 11, respectively, are some possible implementations of the IC device 100 depicted in FIG. 1. However, the IC device 100 depicted in FIG. 1 can be implemented differently from the IC devices depicted in FIGS. 7-11 and the invention is not restricted to the particular implementation of the IC devices depicted in FIGS. 7-11.

Figure 7:
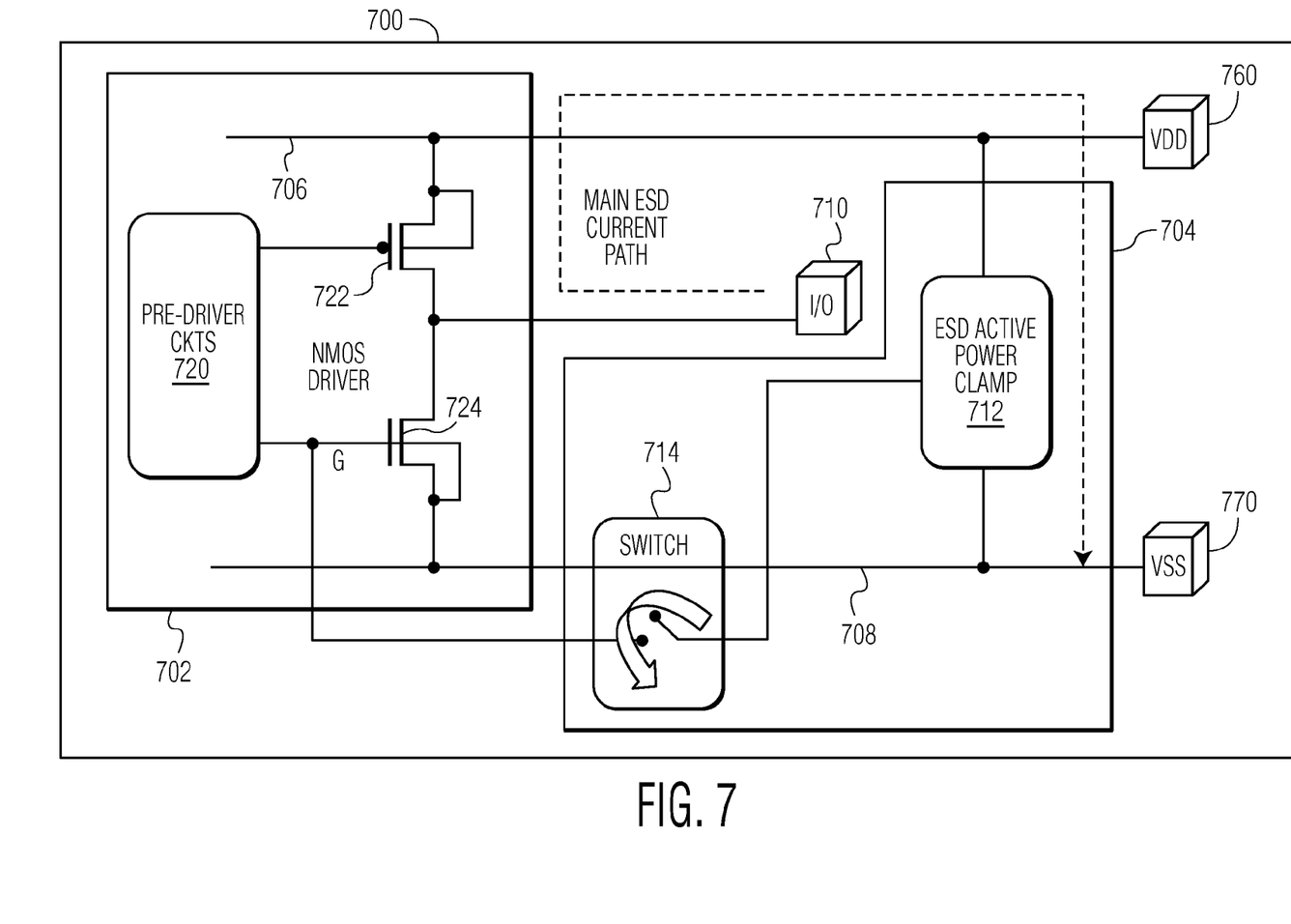
FIG. 7 depicts an embodiment of the IC device depicted in FIG. 1 that uses an ESD power clamp to control a switch device.

FIG. 7 depicts an embodiment of the IC device 100 depicted in FIG. 1 that uses an active ESD power clamp 712 to control the switch device 114. In the embodiment depicted in FIG. 7, an IC device 700 includes an I/O device 702 and an ESD protection device 704 that is used to protect the I/O device during an ESD event.

The I/O device 702 of the IC device 700 includes pre-driver circuits 720, a PMOS driver circuit 722, and an NMOS driver circuit 724. In the embodiment depicted in FIG. 7, the I/O device is connected to a high power supply rail 706, a low power supply rail 708, and an I/O terminal 710. The high power supply rail is connected to a voltage pin 760 having a voltage, "$V_{DD}$," while the low power supply rail is connected to a voltage pin 770 having a voltage, "$V_{SS}$." The ESD protection device 704 of the IC device 700 includes an active ESD power clamp 712 and a switch device 714 configured to be activated to turn off the NMOS driver circuit during the ESD event and to be deactivated to turn on the NMOS driver circuit in the absence of an ESD event. The switch device is configured to control the voltage applied to the gate terminal, "G," of the NMOS driver circuit. In some embodiments, the switch device is configured to connect the gate terminal, "G," of the NMOS driver circuit to ground during an ESD event and to disconnect the NMOS device from ground in the absence of an ESD event. In the embodiment depicted in FIG. 7, the switch device is only activated during an ESD event and remains inactive under normal operation. Consequently, the switch device does not interfere with the normal operation of the I/O device 702.

An example of the operation of the ESD protection device 704 is described as follows. During an ESD event, positive zapping from the I/O terminal 710 to the low power supply rail 708 causes the ESD current to be conducted along the main ESD current path and the switch device to be simultaneously turned on such that the gate terminal, "G," of the NMOS driver circuit 724 is at zero voltage potential. In the absence of an ESD event, the switch device is turned off such that the switch device does not interfere with the I/O driver functionality.

Compared to other ESD protection devices, the ESD protection device 704 does not interfere with the normal functionality of the I/O driver circuits 722, 724. In addition, compared to other ESD protection devices that require multiple circuit components, the switch device of the ESD protection device can be implemented as one transistor located adjacent to the ESD active power clamp (e.g., located together in an ESD power clamp system) and therefore does not cause an increase the I/O cell size. Further, compared to other ESD protection devices, the ESD protection device does not require an extra shunt ESD protection device. Consequently, the ESD protection device 704 has a smaller footprint on the substrate. Additionally, compared to other ESD protection devices, the ESD protection device can be easily implemented in a whole-chip I/O design.

Figure 8:
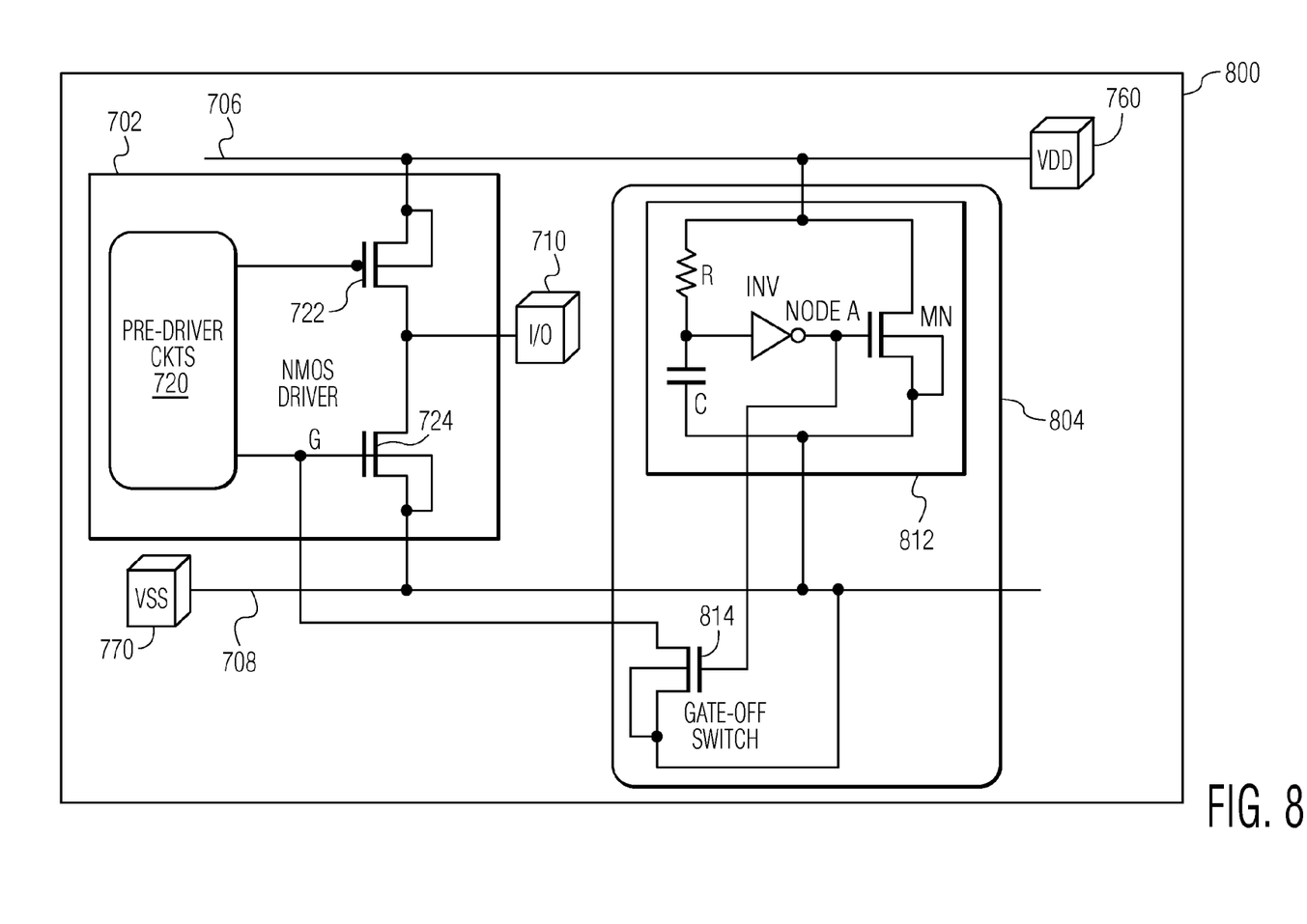
FIG. 8 depicts an embodiment of the IC device depicted in FIG. 7.

FIG. 8 depicts an embodiment of the IC device 700 depicted in FIG. 7. In the embodiment depicted in FIG. 8, an IC device 800 includes the I/O device 702 and an ESD protection device 804 that is used to protect the I/O device during an ESD event. The ESD protection device is implemented as an ESD power clamp system, which includes an active ESD power clamp 812 and a switch device 814 (which is implemented as a gate-off transistor). In the embodiment depicted in FIG. 8, the active ESD power clamp 812 includes a capacitor (C), a resistor (R), an inverter (INV) and a bigFET (Field-effect transistor) (MN). The active ESD power clamp 812 depicted in FIG. 8 is one of the possible implementations of the active ESD power clamp 712 depicted in FIG. 7. However, the active ESD power clamp 712 depicted in FIG. 7 can be implemented differently from the active ESD power clamp 812 depicted in FIG. 8 and the invention is not restricted to the particular implementation of the active ESD power clamp 812 depicted in FIG. 8.

An example of the operation of the ESD protection device 804 is described as follows. During an ESD event, node, "A," is at high voltage potential such that the gate-off transistor is turned on. The gate-off transistor 814 pulls down the gate terminal, "G," of the NMOS driver circuit 724 to zero voltage potential. In the absence of an ESD event, the node, "A," is at zero voltage potential such that the gate-off transistor is turned off and no interference is experienced by the I/O cell functionality. Consequently, the NMOS driver circuit operates in a bipolar snapback mode.

Figure 9:
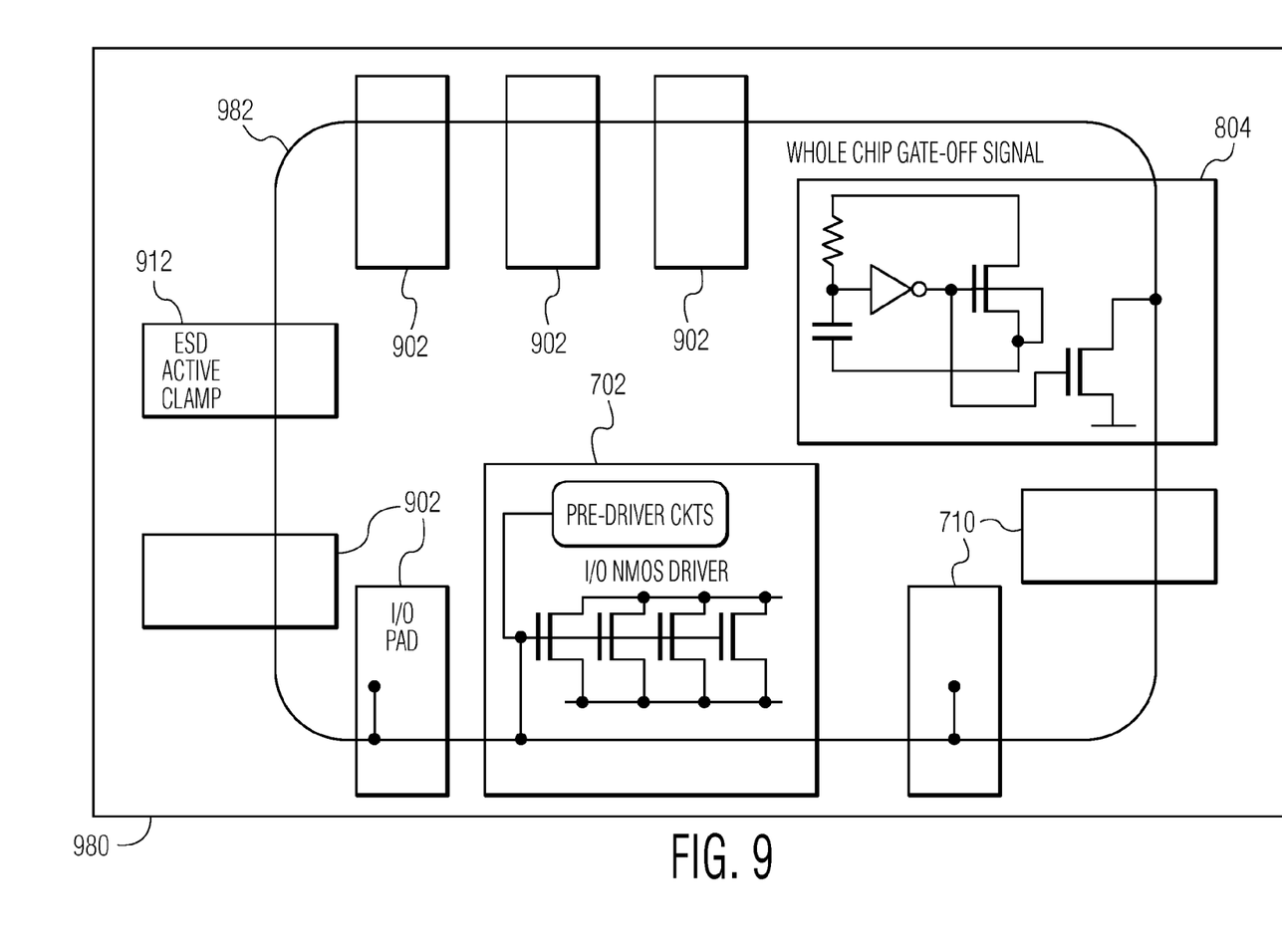
FIG. 9 depicts an IC chip that includes the IC device depicted in FIG. 8 in accordance with an embodiment of the invention.

FIG. 9 depicts an IC chip 980 that includes the IC device 800 depicted in FIG. 8 in accordance with an embodiment of the invention. In the embodiment depicted in FIG. 9, the IC chip is a whole-chip I/O ring, which includes the I/O device 702, the ESD protection device 804, other I/O devices (I/O terminals/pads) 902, and an ESD power clamp 912 (which is the same as, or similar to, the ESD power clamp 812). The IC chip depicted in FIG. 9 has a whole chip gate-off signal line 982 that is shared among different components of the IC chip and is connected to the gate terminal of the NMOS driver circuit inside each I/O cell. Consequently, the gate-off transistor is shared by all I/O cells, which reduces circuit footprint. In some embodiments, the IC chip has multiple power domains and each power domain has its own ESD arrangement.

Figure 10:
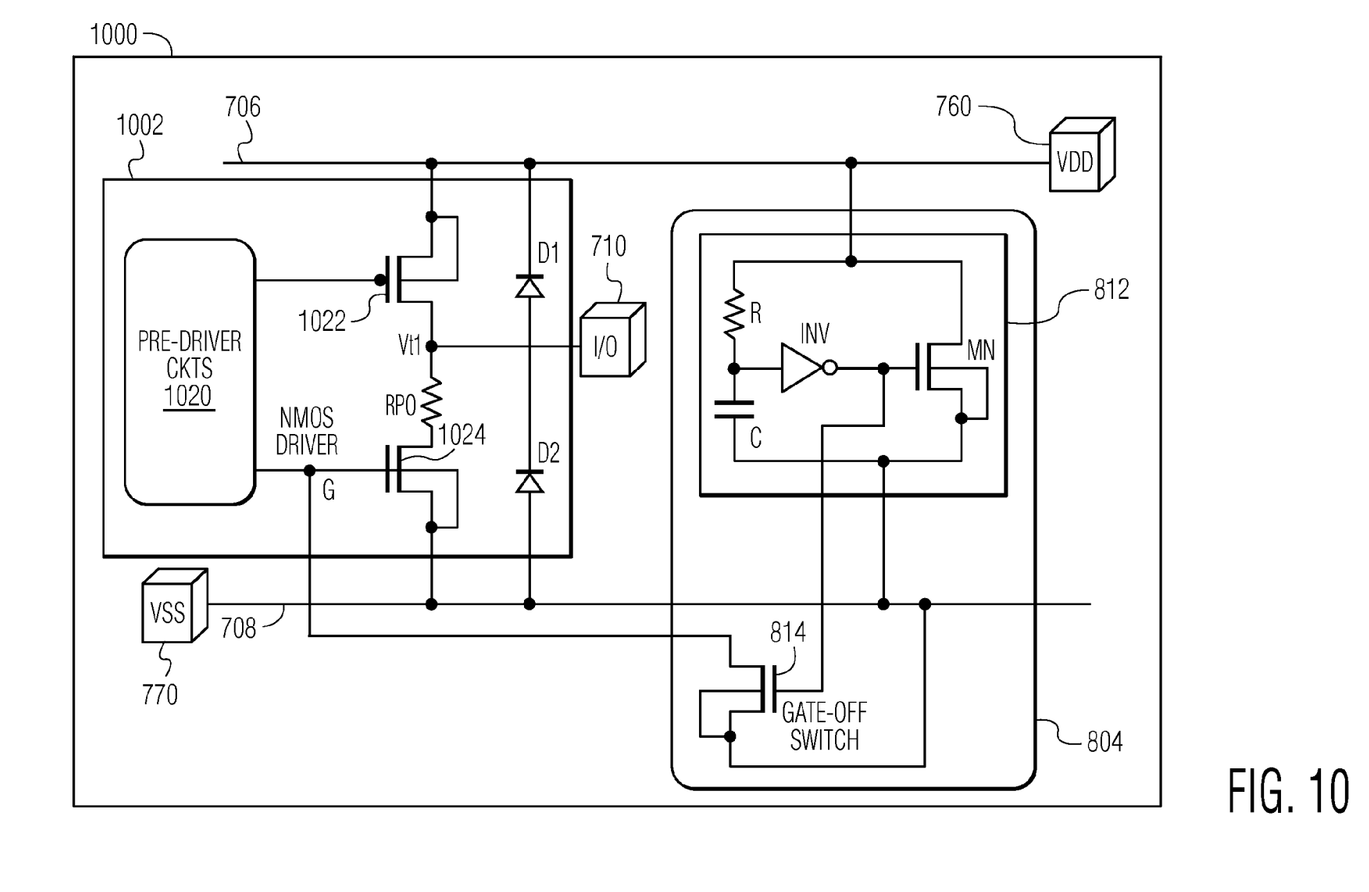
FIG. 10 depicts an embodiment of the IC device depicted in FIG. 7 that uses silicide blocking for a NMOS driver circuit.

FIG. 10 depicts an embodiment of the IC device 700 depicted in FIG. 7 that uses silicide blocking for the NMOS driver circuit. In the embodiment depicted in FIG. 10, an IC device 1000 includes an I/O device 1002 and the ESD protection device 804, which is used to protect the I/O device during an ESD event. The I/O device includes pre-driver circuits 1020, a PMOS driver circuit 1022, an NMOS driver circuit 1024, and diodes, "D1," "D2." Silicide blocking (e.g., a resistor protector oxide (RPO) block mask) is added on the drain side of the NMOS driver circuit to enhance ESD capability. Although the diodes, "D1," and "D2," are shown in FIG. 10 as being part of the I/O device, in other embodiments, the diodes, "D1," and "D2," are part of the ESD protection device. The ESD protection device is implemented as an ESD power clamp system, which includes the active ESD power clamp 812 and the switch device 814 that is implemented as a gate-off transistor. Compared to other IC devices with ESD protection, the IC device can achieve a robust and efficient ESD protection and improve the failure voltage of the NMOS driver circuit.

Figure 11:
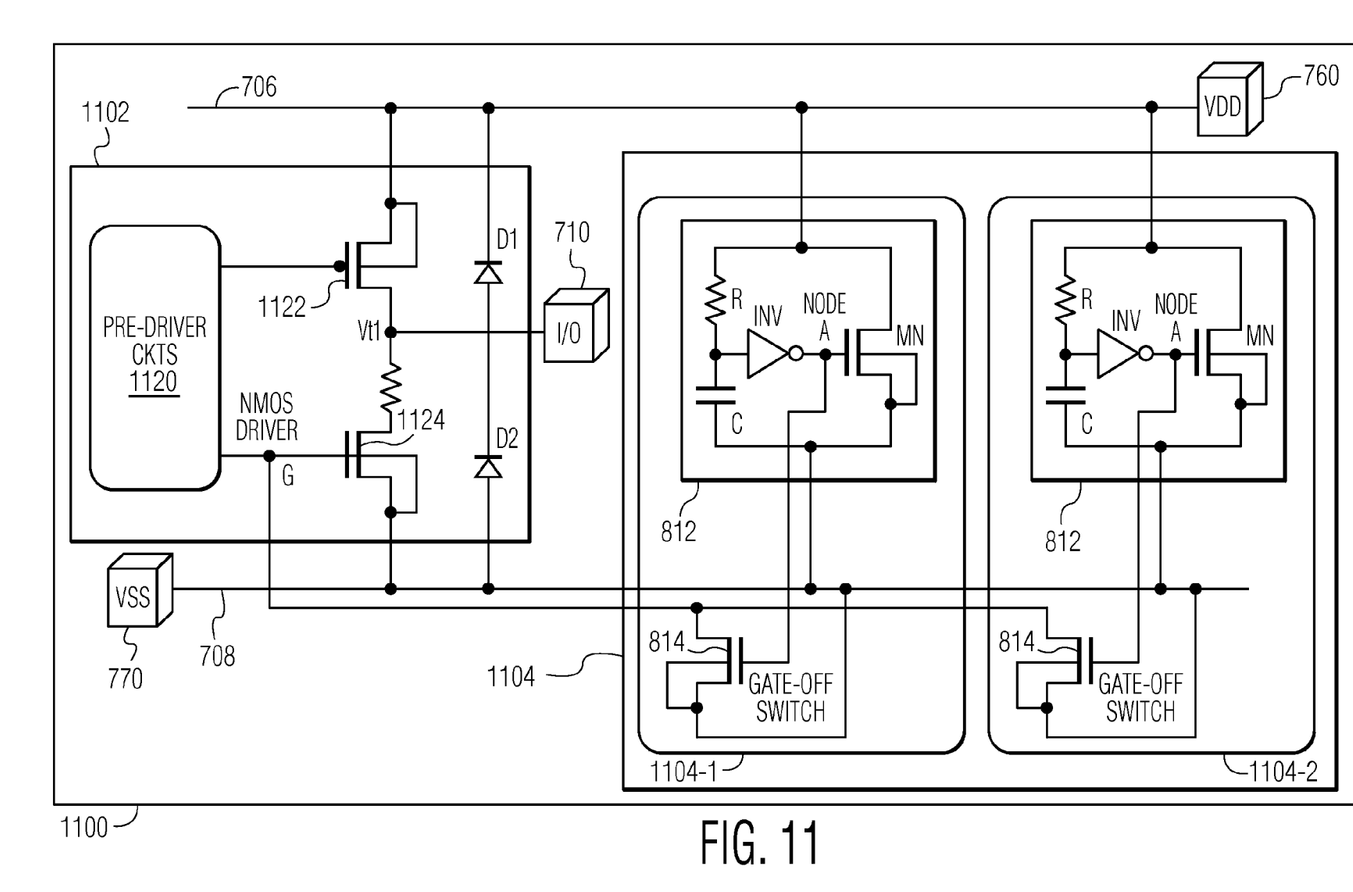
FIG. 11 depicts an embodiment of the IC device depicted in FIG. 7 that uses two parallel active ESD power clamps.

FIG. 11 depicts an embodiment of the IC device 700 depicted in FIG. 7 that uses two parallel active ESD power clamps. In the embodiment depicted in FIG. 11, an IC device 1100 includes an I/O device 1102 and an ESD protection device 1104 that is used to protect the I/O device during an ESD event. The I/O device includes pre-driver circuits 1120, a PMOS driver circuit 1122, an NMOS driver circuit 1124, and diodes, "D1," "D2." Although the diodes, "D1," and "D2," are shown in FIG. 11 as being part of the I/O device, in other embodiments, the diodes, "D1," and "D2," are part of the ESD protection device. The ESD protection device is implemented as an ESD power clamp system 1104-1, 1104-2, which includes two active ESD power clamps 812 and two switch devices 814 that are implemented as gate-off transistors. The active ESD power clamps and the gate-off transistors are connected in parallel branches. The ESD protection device can be used in applications in which silicide blocking is not allowed due to functional requirements. Compared to other IC devices with ESD protection, the IC device can improve the failure voltage of the NMOS driver circuit using the active ESD power clamps that are connected in parallel with each other.

Figure 12:
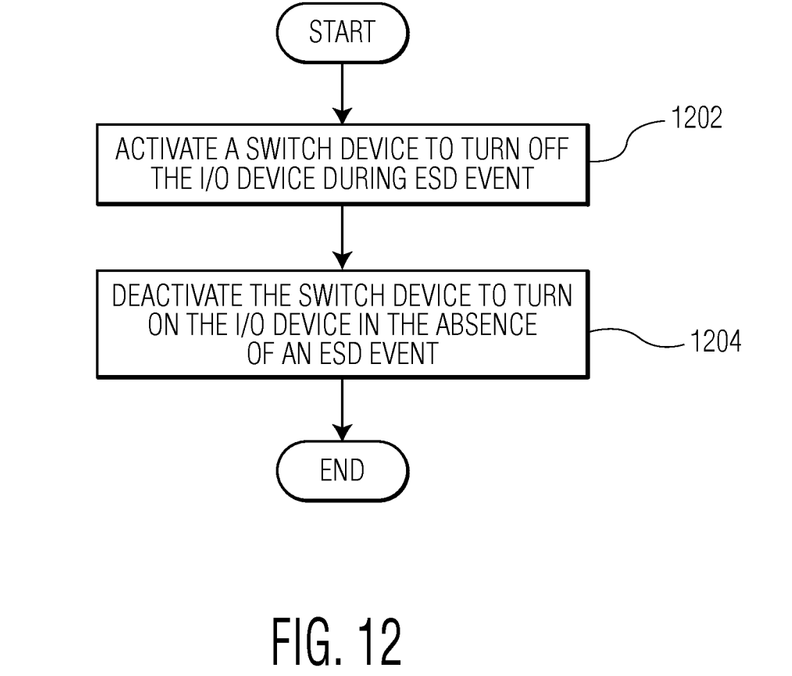
FIG. 12 is a process flow diagram of a method for providing ESD protection for an Input/Output (I/O) device in accordance with an embodiment of the invention.

FIG. 12 is a process flow diagram of a method for providing ESD protection for an Input/Output (I/O) device in accordance with an embodiment of the invention. The I/O device may be the same as, or similar to, the I/O devices 100, 200, 400, 600, 700, 800, 1000, 1100 depicted in FIGS. 1, 2, 4, 6-8, 10, and 11. At block 1202, a switch device is activated to turn off the I/O device during an ESD event. At block 1204, the switch device is deactivated to turn on the I/O device in the absence of an ESD event. The switch device may be the same as or similar to the switch devices 114, 214, 714, 814 depicted in FIGS. 1, 2, 4, 6-8, 10, and 11.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more features.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for providing electrostatic discharge (ESD) protection for an Input/Output (I/O) device, the method comprising:

activating a switch device to turn off the I/O device during an ESD event, wherein the switch device is directly connected to a trigger device configured to generate an ESD trigger signal during the ESD event and is not directly connected to an ESD power clamp, and wherein the trigger device and the ESD power clamp are connected to different voltage lines; and deactivating the switch device to turn on the I/O device in the absence of an ESD event.

2. The method of claim 1, further comprising:

generating an ESD trigger signal during the ESD event, wherein activating the switch device to turn off the I/O device comprises activating the switch device in response to the ESD trigger signal.

3. The method of claim 1, further comprising:

conducting an ESD current using an ESD protection device during the ESD event, wherein the ESD protection device comprises the ESD power clamp.

4. The method of claim 3, wherein conducting the ESD current using the ESD protection device comprises generating the ESD trigger signal using the ESD protection device during the ESD event, and wherein activating the switch device to turn off the I/O device comprises activating the switch device in response to the ESD trigger signal.

5. The method of claim 1, wherein activating the switch device to turn off the I/O device comprises controlling an application of a voltage at a gate terminal of the I/O device during the ESD event.

6. The method of claim 1, wherein activating the switch device to turn off the I/O device comprises connecting a gate terminal of the I/O device to a voltage terminal during the ESD event.

7. The method of claim 6, wherein the voltage terminal has a voltage of zero volt.

8. The method of claim 6, wherein deactivating the switch device to turn on the I/O device comprises disconnecting the gate terminal of the I/O device from the voltage terminal in the absence of an ESD event.

9. An electrostatic discharge (ESD) protection device for an Input/Output (I/O) device, the ESD protection device comprising:

an ESD element configured to conduct an ESD current during an ESD event; and a switch device configured to be activated to turn off the I/O device during the ESD event and to be deactivated to turn on the I/O device in the absence of an ESD event, wherein the switch device is directly connected to a trigger device configured to generate an ESD trigger signal during the ESD event and is not directly connected to an ESD power clamp of the ESD element, and wherein the trigger device and the ESD power clamp are connected to different voltage lines.

10. The ESD protection device of claim 9, wherein the ESD element is configured to generate an ESD trigger signal by conducting the ESD current during the ESD event, wherein the switch device is configured to be activated in response to the ESD trigger signal.

11. The ESD protection device of claim 9, wherein the switch device is configured to be activated in response to the ESD trigger signal.

12. The ESD protection device of claim 9, wherein the switch device is configured to control an application of a voltage at the I/O device.

13. The ESD protection device of claim 9, wherein the switch device is configured to control an application of a voltage at a gate terminal of the I/O device during the ESD event and in the absence of an ESD event.

14. The ESD protection device of claim 13, wherein the I/O device comprises an NMOS device, and wherein the switch device is configured to control the application of the voltage at a gate terminal of the NMOS device during the ESD event and in the absence of an ESD event.

15. The ESD protection device of claim 9, wherein the I/O device comprises an NMOS device, and wherein the switch device is configured to connect a gate terminal of the NMOS device to ground during the ESD event.

16. The ESD protection device of claim 15, wherein the switch device is configured to disconnect the NMOS device from the ground in the absence of an ESD event.

17. An Input/Output (I/O) device, the I/O device comprising:

an NMOS I/O driver circuit connected to an I/O terminal;

an ESD element configured to conduct an ESD current away from the NMOS I/O driver during an ESD event; and a switch device configured to be activated to turn off the NMOS I/O driver circuit during the ESD event and to be deactivated to turn on the NMOS I/O driver circuit in the absence of an ESD event, wherein the switch device is directly connected to a trigger device configured to generate an ESD trigger signal during the ESD event and is not directly connected to an ESD power clamp of the ESD element, and wherein the trigger device and the ESD power clamp are connected to different voltage lines.

18. The I/O device of claim 17, wherein the switch device comprises a single transistor.

19. The ESD protection device of claim 9, wherein the trigger device is connected to a first voltage line, wherein the ESD power clamp is connected to a second voltage line, wherein the trigger device and the ESD power clamp are connected to a third voltage line, and wherein voltages of the first, second, and third voltage lines are different from each other.

* * * * *